US012793804B2

(12) United States Patent
Matsubara et al.

(10) Patent No.: US 12,793,804 B2
(45) Date of Patent: Nov. 10, 2026

(54) APPARATUS INCLUDING BTI CONTROLLER

(71) Applicant: MICRON TECHNOLOGY, INC., Boise, ID (US)

(72) Inventors: Yasushi Matsubara, Isehara (JP); Yoshinori Fujiwara, Boise, ID (US); Takuya Tamano, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 86 days.

(21) Appl. No.: 18/751,936

(22) Filed: Jun. 24, 2024

(65) Prior Publication Data

US 2025/0104792 A1 Mar. 27, 2025

Related U.S. Application Data

(60) Provisional application No. 63/584,575, filed on Sep. 22, 2023.

(51) Int. Cl.

*G11C 29/18* (2006.01)
*G11C 29/12* (2006.01)

(52) U.S. Cl.

CPC ........ *G11C 29/18* (2013.01); *G11C 29/12015* (2013.01)

(58) Field of Classification Search

CPC .... G11C 29/18; G11C 29/12015; G11C 29/06
See application file for complete search history.

(56) References Cited

U.S. PATENT DOCUMENTS

| | | | | |
|---|---|---|---|---|
| 7,872,930 | B2 | 1/2011 | Chen et al. | |
| 10,447,267 | B1 | 10/2019 | Waldrop | |
| 10,840,908 | B2 | 11/2020 | Waldrop | |
| 11,320,479 | B2 | 5/2022 | Plum et al. | |
| 2004/0049629 | A1* | 3/2004 | Miura | G06F 11/1068 711/E12.083 |
| 2005/0232059 | A1* | 10/2005 | Miura | G06F 12/0246 365/230.03 |
| 2024/0071446 | A1* | 2/2024 | Kim | G11C 11/40618 |

* cited by examiner

*Primary Examiner* — Mohammed A Bashar
(74) *Attorney, Agent, or Firm* — Dorsey & Whitney LLP

(57) ABSTRACT

According to one or more embodiments of the disclosure, an apparatus comprises a memory device and a bias temperature instability (BTI) controller. The BTI controller generates and outputs a command and address signal for memory testing. The command and address signal causes the memory device in the idle state to operate for the testing.

20 Claims, 9 Drawing Sheets

APPARATUS INCLUDING BTI CONTROLLER

CROSS REFERENCE TO RELATED APPLICATION(S)

This application claims priority to U.S. Provisional Application No. 63/584,575, filed Sep. 22, 2023. The aforementioned application is incorporated herein by reference, in its entirety, for any purpose.

BACKGROUND

Bias temperature instability (BTI) is one of the important reliability factors in semiconductor devices, such as memory devices. Uneven electrical stress on circuits of a memory device during low power mode or during high temperature, high voltage testing may cause increased susceptibility of the device to, especially, negative BTI (NBTI). NBTI may lead to degradation of device performance, including increased transistor threshold voltage. For example, switching speed of devices may slow down due to degradation by NBTI. As a threshold voltage becomes higher, switching speed may slow down further. Therefore, there is a demand for a technique to reduce uneven electrical stress and mitigate the device performance degradation caused by BTI, such as NBTI.

DETAILED DESCRIPTION

Figure 1:
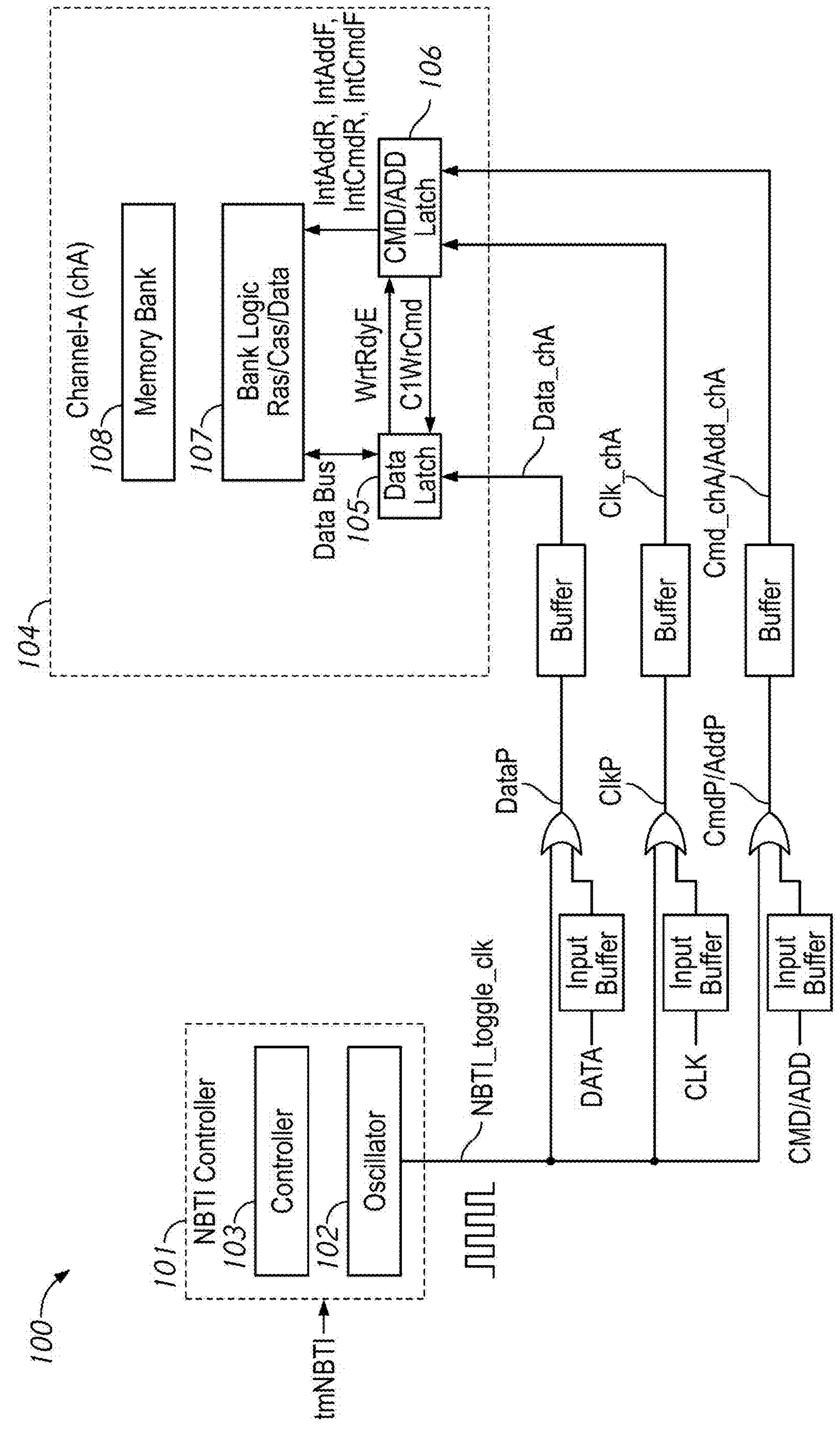
FIG. 1 is a block diagram of an example apparatus according to an embodiment of the disclosure.

Various example embodiments of the disclosure will be described below in detail with reference to the accompanying drawings. The following detailed descriptions refer to the accompanying drawings that show, by way of illustration, specific aspects in which embodiments of the disclosure may be practiced. These embodiments are described in sufficient detail to enable those skilled in the art to practice the disclosure. Other embodiments may be utilized, and structure, logical and electrical changes may be made without departing from the scope of the disclosure. The various embodiments disclosed herein are not necessary mutually exclusive, as some disclosed embodiments can be combined with one or more other disclosed embodiments to form new embodiments.

In the descriptions, common or related elements and elements that are substantially the same are denoted with the same signs, and the descriptions thereof may be reduced or omitted. In the drawings, some of the same signs may be omitted for the same or substantially the same elements for ease of illustration. In the drawings, the dimensions and dimensional ratios of each unit do not necessarily match the actual dimensions and dimensional ratios in the embodiments.

FIG. 1 is a block diagram of an example apparatus 100 according to an embodiment of the disclosure. The apparatus 100 of the present embodiment includes a negative-bias temperature instability (NBTI) controller 101 and a memory device 104. In some embodiments of the disclosure, the NBTI controller 101 and the memory device 104 are included in a stacked device that includes one or more core memory devices stacked on an interface device. The NBTI controller 101 may be included in the interface device, and the memory device 104 may be included in the one or more core memory devices. In some embodiments, the NBTI controller 101 may be included in the one or more core memory devices. In some embodiments, the memory device 104 may include one or more memory channels. Each of the memory channels of the memory device may be accessed independently of one another, and include circuits to perform independent access operations. For example, in some embodiments, each memory channel includes a memory bank, bank logic, a data latch, and a command address latch. For the descriptions herein, the term "coupled" may include "connected."

The NBTI controller 101 includes an oscillator 102 and a controller 103. The NBTI controller 101 receives a test mode signal (tmNBTI). The tmNBTI signal is set to a high level to enable a test mode during, for example, an idle state of the memory device 104. When the test mode is enabled, NBTI mitigation operations or functions are performed. In one instance, the tmNBTI signal may be provided from outside of the apparatus 100, such as a tester (for example, an automated test equipment ATE) coupled to the apparatus 100. In another instance, the tmNBTI signal may be provided by a test mode generation circuit within the apparatus 100. The test mode signal tmNBTI may include a NBTI mitigation enable signal. In some embodiments, the test mode may include a mode for testing a memory device and/or a mode that is enabled in normal use (or during normal operation) of a memory device product.

Upon receipt of the tmNBTI signal, the NBTI controller 101 starts to output a regularly clocking signal or a regularly toggling clock signal (NBTI_toggle_clk) to a data path (DataP), a clock path (ClkP), a command/address path (CmdP/AddP). On each path, there is an OR instance, such as a logic OR gate. Herein, command and address may be referred to as CMD/ADD. The NBTI_toggle_clk signal has, for example, 0 and 1 (or low and high) pulses regularly toggling with a certain cycle time. A data input (for example, Data_ChA for a channel A as illustrated in the drawing among a plurality of channels A, B, C, and so on of the memory device 104) is coupled to a data latch 105 in the memory device 104. A clock input (Clk_chA for the channel A in the example drawing) and a CMD/ADD input (Cmd_chA/Add_chA for the channel A in the example drawing) is coupled to a CMD/ADD latch 106. The NBTI_toggle_clk signal is provided to DataP, ClkP, and CmdP/AddP through the OR instances and provided to Data_chA, Clk_chA, and Cmd_chA/Add_chA through respective buffers. The data latch 105 and the CMD/ADD latch 106 may be part of control circuits in the memory device 104. The memory device 104 also includes a bank logic 107 and a memory bank 108. The bank logic 107 communicates with the data latch 105 and the CMD/AMD latch 106 with respect to data, operation command, memory address, and such. The memory bank 108 communicates with the bank logic 107 for memory operations, such as data read and data write.

NBTI control operation by the NBTI controller 101 during the test mode when the memory device 104 is in an idle state targets the signal propagating paths and their destination circuits. For example, the signals and circuits which travel and operate with high frequency, such as DATA, CLK, and CMD/ADD, are susceptible to NBTI degradation (for example, performance drop due to NBTI). This NBTI degradation can be mitigated by the NBTI control. For example, as will be described in more detail below, the NBTI controller 101 provides signals to the memory device 104 to perform NBTI mitigation operations during a NBTI mitigation mode. In a case where a conventional controller injects, on the respective paths, the signals with regular-clocking/toggling pulses that are not composed of or regulated with command and address protocols whose transition timings are aligned with the clock signal, the data latch and the CMD/ADD latch, which are configured to output in a memory device merely receive such signals on their gate nodes, junction nodes, and such, and do not respond. For example, the CMD/ADD latch decodes input signals as command and address signals and generate output signals, but if the input signals cannot be decoded as such, there will be no output from the CMD/ADD latch. Since the data latch that operates in response to communication with the CMD/ADD latch does not receive any command signals from the CMD/ADD latch, the data latch also does not output any data signals although it receives them from the data path. The signal propagation thus does not continue to the next stage after the data latch and the CMD/ADD latch within the memory device. Consequently, while the bank logic of the memory device operates with relatively high frequency and is susceptible to uneven electrical stress, such as uneven DC stress, the bank logic as well as the memory banks coupled thereto in the memory channels may not be fully protected from the NBTI degradation, because it is located in the further downstream of the signal propagation and does not receive signal outputs from the data latch and the CMD/ADD latch. In contrast, the NBTI controller 101 provides signals to the memory device 104 to perform NBTI mitigation operations to cause signals to travel and propagate further downstream within the memory device 104 and to effectively reduce the uneven electrical stress, such as the DC stress. As a result, the NBTI degradation and hence the device performance drop can be further effectively prevented or mitigated.

Figure 2:
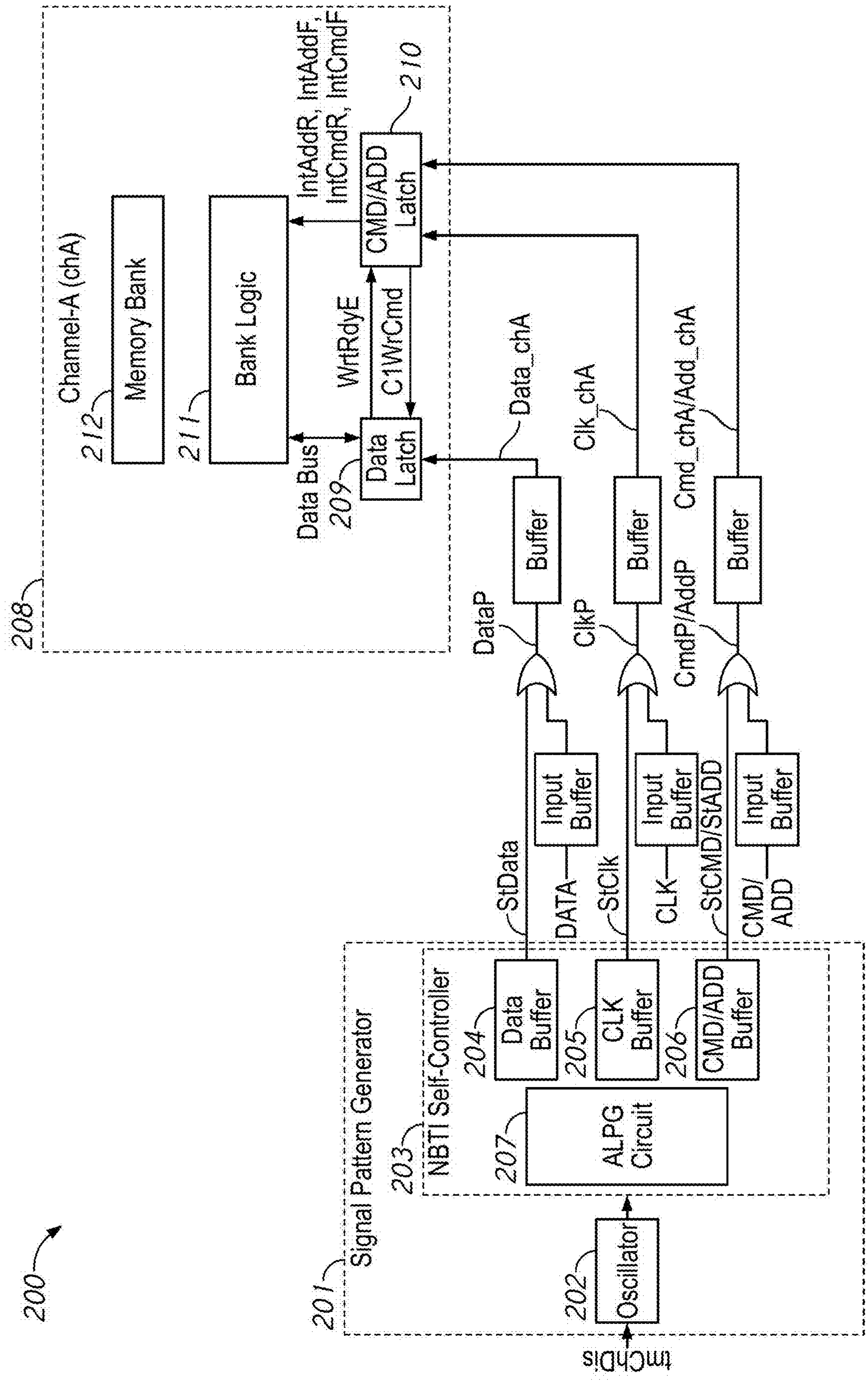
FIG. 2 is a block diagram of an example apparatus according to an embodiment of the disclosure.

FIG. 2 is a block diagram of an example apparatus 200 according to an embodiment of the disclosure. The apparatus 200 of the present embodiment includes a signal pattern generator 201. The signal pattern generator 201 includes an oscillator 202 and an NBTI self-controller 203. In some embodiments, the oscillator 202 and the NBTI self-controller 203 are included in an NBTI controller, for example, NBTI controller 101. The NBTI self-controller 203 may be included in the controller 103 in such embodiments of the disclosure.

The oscillator 202 receives a test mode signal (tmChDis) and provides a toggling clock signal to the NBTI self-controller 203. The tmChDis signal may be provided, for example, by a tester coupled to the apparatus 200 and/or a test mode generation circuit in the apparatus 200, and then provided to the signal pattern generator 201, for example, via an interposer on a package substrate.

The NBTI self-controller 203 includes, a data buffer 204, a clock (CLK) buffer 205, and a command/address buffer 206, and an algorithmic programmable (ALPG) circuit 207. Herein, command and address may be referred to as CMD/ADD. The data buffer 204 may include one or more data buffer circuits designed and configured to buffer data signals received. The CLK buffer 205 may include one or more clock buffer circuits designed and configured to buffer clock signals received. The CMD/ADD buffer 206 may include one of more buffers designed and configured to buffer CMD/ADD signals received. The ALPG circuit 207 may include one or more ALPG circuits designed and configured to provide signals to cause a memory device 208 to perform NBTI mitigation operations when a toggling clock signal is provided by the oscillator 202. The signals provided by the ALPG circuit 207 and the buffers 204, 205, and 206 may include a data signal StData, a self-controller output clock signal StClk, and self-controller command and address signals StCMD/StAdd.

The apparatus 200 includes a memory device 208 coupled to the signal pattern generator 201 or the NBTI self-controller 203 through interface paths and circuits. The interface paths and circuits includes, in some embodiments of the disclosure, an OR instance, such as a logic OR gate, and a buffer. The memory device 208 includes one or more memory channels (Chs). Each memory channel includes one or more memory banks 212. The memory banks 212 may be arranged in array in memory regions or cell regions on a semiconductor substrate of the memory device 208. Each memory bank 212 may include an array of memory cells. The memory banks 212 may be accessed to read data from and write data to the memory cells. Various circuits and circuit elements (e.g., logic circuits, transistors, capacitors, diodes) that are used for memory operations may be provided in the memory regions and/or periphery regions around the memory regions.

The memory device 208 also includes a bank logic 211 coupled to the memory banks 212. The bank logic 211 may include one or more logic circuits for memory operations.

The memory device 208 further includes a data latch 209 and a CMD/ADD latch 210. In the illustrated example, the data latch 209 is coupled to the data buffer 204 in the signal pattern generator 201 through the interface paths and circuits. The CMD/ADD latch 210 is coupled to the CLK buffer 205 and the CMD/ADD buffer 206 in the signal pattern generator 201 through the interface paths and circuits. The data latch 209 may include a plurality of latch circuits configured for latching data signals received. The CMD/ADD latch 210 may include a plurality of latch circuits configured for latching memory command and address signals received. The data latch 209 and the CMD/ADD latch 210 may be part of control circuits in the memory device 208. The StData, StClk, and StCMD/StADD signals provided by the signal pattern generator 201 are provided to the memory device 208 over the interface paths and circuits as respectively, data input Data_chA, a clock input Clk_chA, and a CMD/ADD input Cmd_chA/Add_chA. The data input Data_chA is provided to the data latch 209, and the clock input Clk_chA and CMD/ADD input Cmd_chA/Add_chA are provided to the CMD/ADD latch 210.

Figure 3:
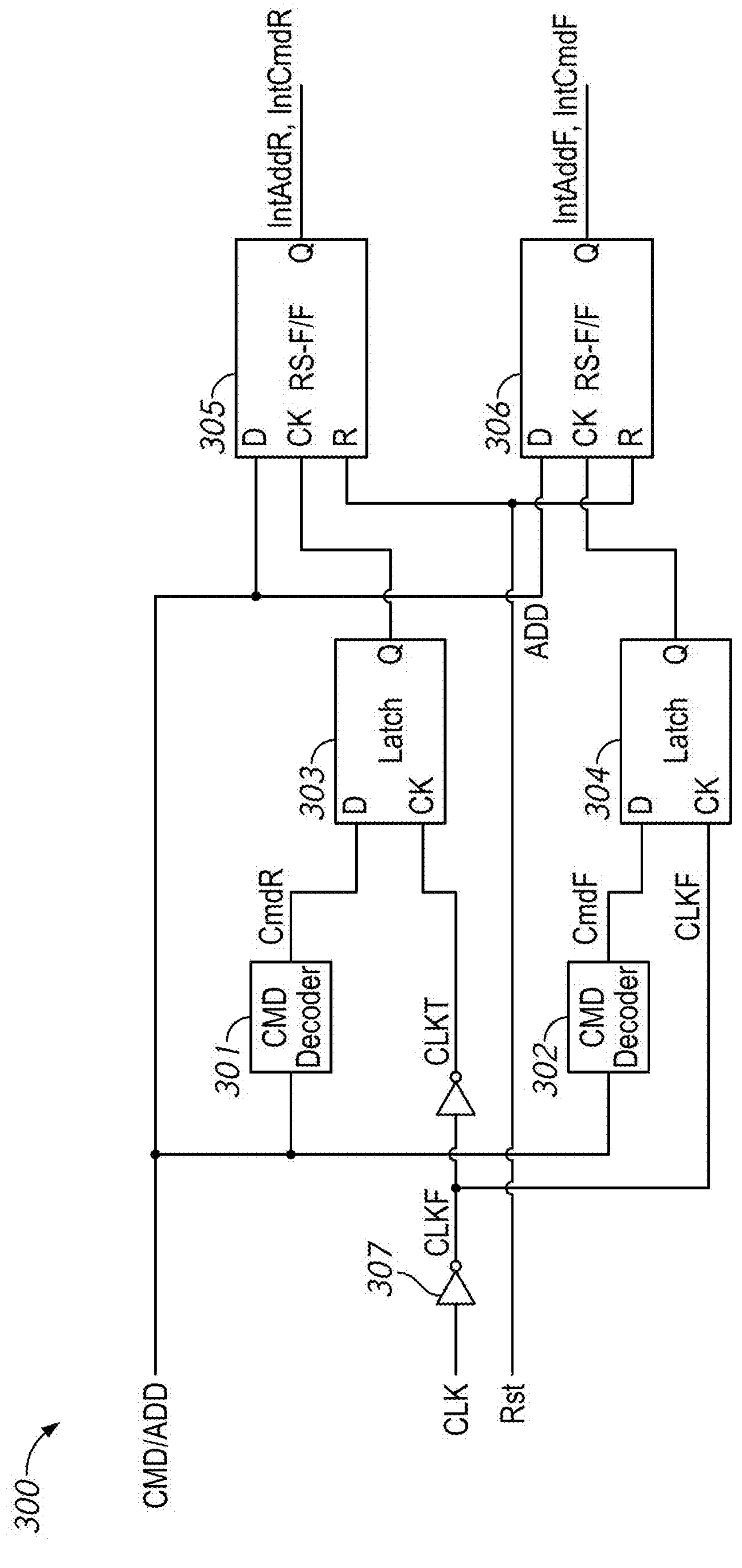
FIG. 3 is a block diagram of an example command and address latch according to an embodiment of the disclosure.

FIG. 3 is a block diagram of an example command and address (CMD/ADD) latch 300 according to an embodiment of the disclosure. In some embodiments of the disclosure, the CMD/ADD latch 300 may be the CMD/ADD latch 210 of the memory device 208. The CMD/ADD latch 300 may include one or more CMD decoders, one or more latches, and one or more set/reset flip flops (RS-F/Fs). In the illustrated example, The CMD/ADD latch 300 includes a pair of first and second CMD decoders 301 and 302 with a pair of first and second latches 303 and 304 and a pair of first and second RS-F/Fs 305 and 306 corresponding to each other. The first and second CMD decoders 301 and 302 of the pair may have the same or substantially the same circuit structure. The first and second latches 303 and 304 of the pair may have the same or substantially the same circuit structure. The first and second RS-F/Fs 305 and 306 of the pair may have the same or substantially the same circuit structure.

A CMD/ADD signal is provided to the first CMD decoder 301 and the second CMD decoder 302. The first CMD decoder 301 provides a decoded command signal (CmdR) to a D line (or a D input terminal) of the first latch 303. An inverted clock signal (CLKT) generated from an input clock signal (CLK) by a pair of first and second inverters 307 and 308 arranged in series is input to a CK line (or a CK input terminal) of the first latch 303. The first latch 303 provides a Q output to a CK line of the first RS-F/F 305. The CMD/ADD signal is also input to a D line of the first RS-F/F 305. A reset signal (Rst) is supplied to an R line (or an R input terminal) of the first RS-F/F 305. The first RS-F/F 305 outputs an internal address signal (IntAddR) and an internal command signal (IntCmdR). The first latch 303 may include one or more latch circuits, with each latch circuit corresponding to a signal of the decoded command signal CmdR. The first RS-F/F 305 may include one or more flip flop circuits, with each flip flop circuit corresponding to a signal of the CMD/ADD signal and providing a signal for the internal command signal IntCmdR and/or internal address signal IntAddR.

The second CMD decoder 302 provides a decoded command signal (CmdF) to a D line of the second latch 304. An inverted clock signal (CLKF) generated from the input CLK signal by the first inverter 307 is input to a CK line of the second latch 304. The second latch 304 provides a Q output to a CK line of the second RS-F/F 306. The CMD/ADD signal is also input to a D line of the second RS-F/F 306. The Rst signal is also input to an R line of the second RS-F/F 306. The second RS-F/F 306 outputs an internal address signal (IntAddF) and an internal command signal (IntCmdF). The second latch 304 may include one or more latch circuits, with each latch circuit corresponding to a signal of the decoded command signal CmdF. The second RS-F/F 306 may include one or more flip flop circuits, with each flip flop circuit corresponding to a signal of the CMD/ADD signal and providing a signal for the internal command signal IntCmdF and/or internal address signal IntAddF. When activated, the reset signal Rst may be used to reset a state of the Q output of the first and second RS-F/Fs 305 and 306.

In operation, the first latch 303 provides decoded command signal CmdR as its Q output for rising edges of the clock signal CLK, and the second latch 304 provides decoded command signal CmdF as its Q output for falling edges of the clock signal CLK. For the first latch 303, the Q output causes the first RS-F/F 305 to provide the CMD/ADD signal as internal command signal IntCmdR and internal address signal IntAddR associated with a rising edge of the clock signal CLK. For the second latch 304, the Q output causes the second RS-F/F 306 to provide the CMD/ADD signal as internal command signal IntCmdF and internal address signal IntAddF associated with a falling edge of the clock signal CLK.

Figure 4:
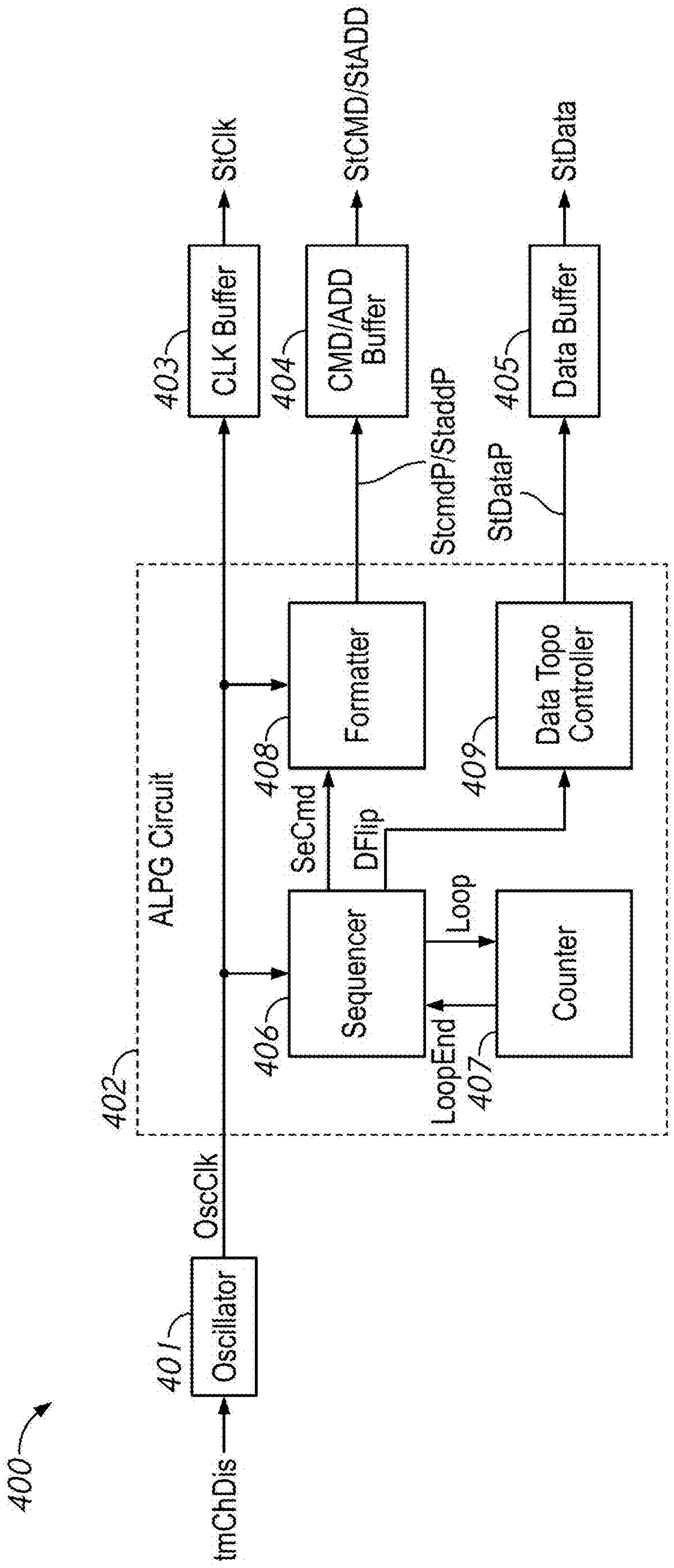
FIG. 4 is a block diagram of an example signal pattern generator according to an embodiment of the disclosure
Figure 5:
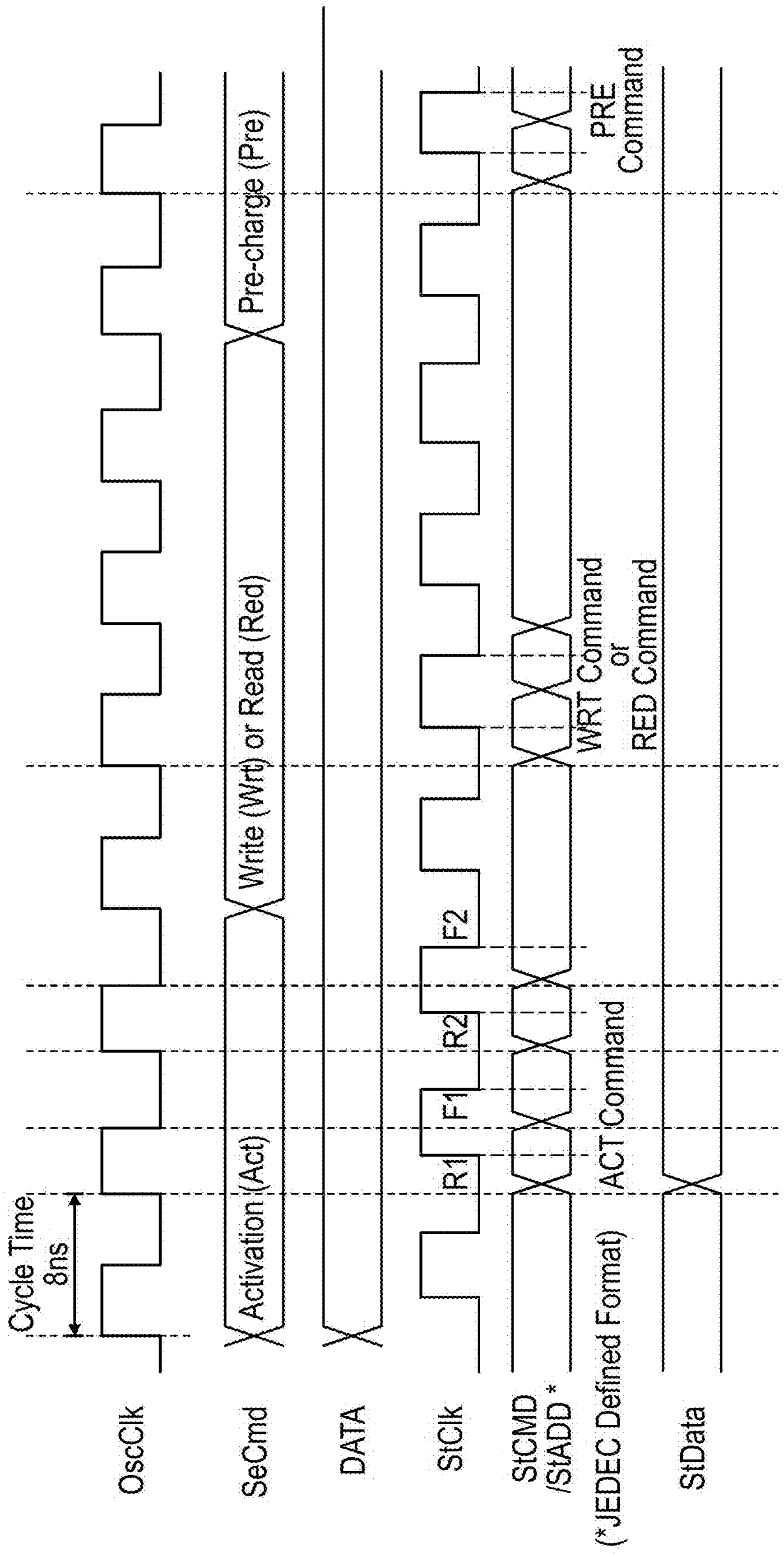
FIG. 5 is a diagram of example signal waveforms for NBTI control according to an embodiment of the disclosure.
Figure 6:
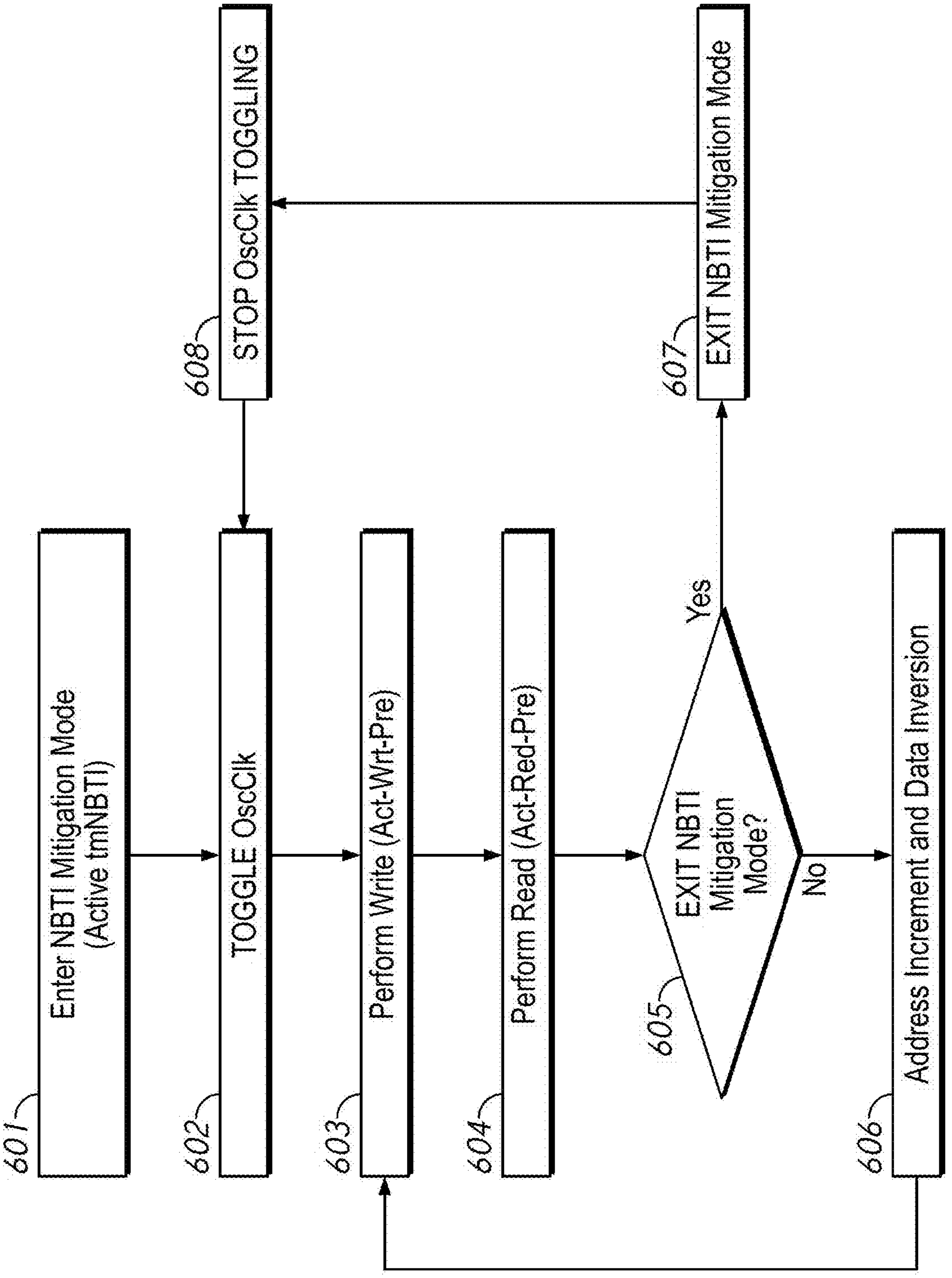
FIG. 6 is a flow chart of an example channel-disable mode function according to an embodiment of the disclosure.

FIG. 4 is a block diagram of an example of a signal pattern generator 400 according to an embodiment of the disclosure. FIG. 5 is a diagram of example of signal waveforms for NBTI control according to an embodiment of the disclosure. FIG. 6 is a flow chart of an example channel-disable mode function according to an embodiment of the disclosure.

The signal pattern generator 400 may be included in the NBTI controller 101 of apparatus 100 and/or signal pattern generator 201 of apparatus 200 in some embodiments of the disclosure. The signal pattern generator 400 includes an oscillator 401 and algorithmic programmable (ALPG) circuit 402. The oscillator 401 and the ALPG circuit 402 may be the oscillator 202 and the ALPG circuit 207 of the NBTI self-controller 203 of the signal pattern generator 201 of the apparatus 200, respectively. The signal pattern generator 400 also includes a CLK buffer 403, a CMD/ADD buffer 404, and a data buffer 405, which may be the CLK buffer 205, the CMD/ADD buffer 206, and the data buffer 204, respectively, of the signal pattern generator 201 of apparatus 200. The ALPG circuit 402 includes a sequencer 406, a counter 407, a formatter 408, and a data topology controller 409. The ALPG circuit 402 may be included in the ALPG circuit 207 of the signal pattern generator 201 of the apparatus 200.

When the memory device 208 in an idle state enters a NBTI mitigation mode (601 in FIG. 6) for testing, an active enable signal (tmChDis) is input from outside of the signal pattern generator 400/201. The tmChDis signal may be provided, for example, by a tester coupled to the apparatus 200 and/or a test mode generation circuit in the apparatus 200, and then supplied to the signal pattern generator 400/201.

Upon receipt of the active tmChDis signal, the oscillator 401 is activated, and the clock signal (OscClk) starts toggling. The toggling OscClk is supplied to the ALPG circuit 402 (602 in FIG. 6). The OscClk signal may have, for example, a cycle time of 8 ns in some embodiments (FIG. 5). The cycle time is not limited thereto and may be determined based on specifications, designs, functions, and such. The OscClk signal is input to the sequencer 406 and the formatter 408 of the ALPG circuit 402 as well as the clock buffer 403. From the clock buffer 403, a delayed clock signal from the OscClk signal (FIG. 5) is output as a self-controller output clock signal (StClk) to the designated circuits and paths, such as the OR logic gate and the ClkP path (FIG. 2).

The sequencer 406 of the NBTI self-controller 402 manages a sequence of functions to be performed at given or predetermined timings. The counter 407 counts a number of functions, such as memory operations of activation, data read and write, and pre-charging, to determine how many functions are to be repeated. The counter 407 receives a loop signal (Loop) from the sequencer 406 and provides a loop-stop signal (LoopEnd) to the sequencer 421. The counter 407 may be a counter circuit designed and configured for counting from a default count number, such as 0, to a number incremented by one count or one pitch. The counter circuit may be a multiple-bit counter. The sequencer 406 generates a sequence command signal (SeCmd) in response to the received OscClk and outputs SeCmd to the formatter 408. SeCmd identifies which function, Activation (Act), Write (Wrt) or Read (Red), or Pre-charge (Pre), is to be performed at each given timing (FIG. 5).

Based on the received OscClk and SeCmd, the formatter 408 generates and outputs self-controller command and address signals (StCMD/StAdd) formatted with predefined formats at predefined timings. For example, StCMD/StAdd converted from SeCmd match with or are in compliance with the predefined formats and timings so as to have the command and address transition timings aligned with the certain pulses of the OscClk signal and hence the StCLK signal. Such predefined formats and timings may include or follow, for example, protocols or standards by the standards organizations, such as the Joint Electron Device Engineering Counsel (JEDEC). For example, as illustrated in FIG. 5, StCMD/StADD in compliance with the JEDEC defined formats provide the command for activation (ACT Command) at the defined timings aligned with rising edges and falling edges of the OScClk signal as well as the first rise edge (R1), the first fall edge (F1), the second rise edge (R2), and the second fall edge (F2) of the StClk signal for the designated memory address. Similarly, StCMD/StADD provide a command for data write or read (WRT Command or RED Command) and a command for pre-charge (PRE Command) in compliance with the JEDEC defined formats and timings as illustrated in FIG. 5. StCMD/StADD from the formatter 408 travels through the CMD/ADD path (StcmdP/StaddP) and the CMD/ADD buffer 404/206, further through the logic OR gate and the buffer, and to the CMD/ADD latch 210 of the memory device 208 (FIG. 2).

The sequencer 406 also outputs a data flip command signal (DFlip) to the data topology controller 409. The data topology controller 409 manages a signal polarity based on the DFlip signal received from the sequencer 406. The data topology controller 409 outputs and provides the polarity flipped data signal (StData), for example at the same time as ACT command (FIG. 5), through the StData path (StDataP) and the data buffer 405. StData then travels through the logic OR gate and the buffer to the data latch 209 of the memory device 208 (FIG. 2).

In response to the toggling OscClk signal, and based on the SeCmd signal, the ALPG circuit 402 causes a memory device to perform a write sequence of activation (Act), write (Wrt), and pre-charge (Pre) (603 in FIG. 6). The ALPG circuit 402 may also causes a memory device to perform a read sequence of activation (Act), read (Red), and pre-charge (Pre) (604 in FIG. 6). If the NBTI mitigation mode is not exited (605 in FIG. 6), that is, the tmChDis signal is still at a high level, then an address for at least one of the activation, the write, and the read is increased, and data polarity is changed (606 in FIG. 6). The ALPG circuit 402 then loops the write sequence (Act-Wrt-Pre) and the read sequence (Act-Red-Pre), until the NBTI mitigation mode is exited, that is, tmChDis at a low level is input to the NBTI controller 400. If the NBTI mitigation mode is exited (607 in FIG. 6), that is, the tmChDis signal is at a low level, the OscClk toggling stops (608 in FIG. 6). The memory device 208 then returns to the idle state.

The signal pattern generator 400/201 generates the command and address signals formatted in accordance with the predefined protocols that have the command and address transition timings aligned with the clock signal. The information that specify memory command kinds and the information that specify memory addresses are contained in the formatted command and address signals. The command and address signals, and hence the command and address information, are formatted with the defined manners and output at the defined timings in accordance with, for example, the industry protocols or standards, such as those defined by JEDEC. The formatted command and address signals may be hence referred to as the command and address protocols.

The CMD/ADD latch 210 of the respective channels of the memory device 208 can then respond to the received signals, decode or translate the command (such as Act, Wrt, Red, and Pre) and address (such as a memory bank/cell address), and send out the command signals and the address signals to the bank logic 211 and the data latch 209. Upon receipt of the signals from the CMD/ADD latch 210, the data latch 209 starts to communicate with the bank logic 211 and send out the data signal for testing through a data bus (DataBus). At the same time, the CMD/ADD latch 210 also provides internal command and address signals to the bank logic 211. By these functions, internal paths and circuits of the memory device 208, which are located in the next stage or the further downstream of the signal propagation after the CMD/ADD latch 210 and the DATA latch 209 can operate based on the formatted command and address signals or the command and address protocols. As a result, uneven DC stress may be reduced, and hence the NBTI degradation of such paths and circuits may be mitigated during the idle state of the memory device 208.

In some embodiments, the formatter 408 (FIG. 4) may have a two stage configuration with a first command formatter and a second command formatter. The first command formatter may receive the OscClk signal and the SeCmd signal and provide high frequency outputs of the clock signal and the sequence command signal. The second command formatter may receive the high frequency outputs from the first command formatter and provide low frequency outputs of the clock signal and the sequence command signal as the slow-speed StCMD/StAdd signals. The low-frequency, slow-speed StCMD/StAdd signal makes the stress input cycle slower and can limit current consumption.

Figure 7:
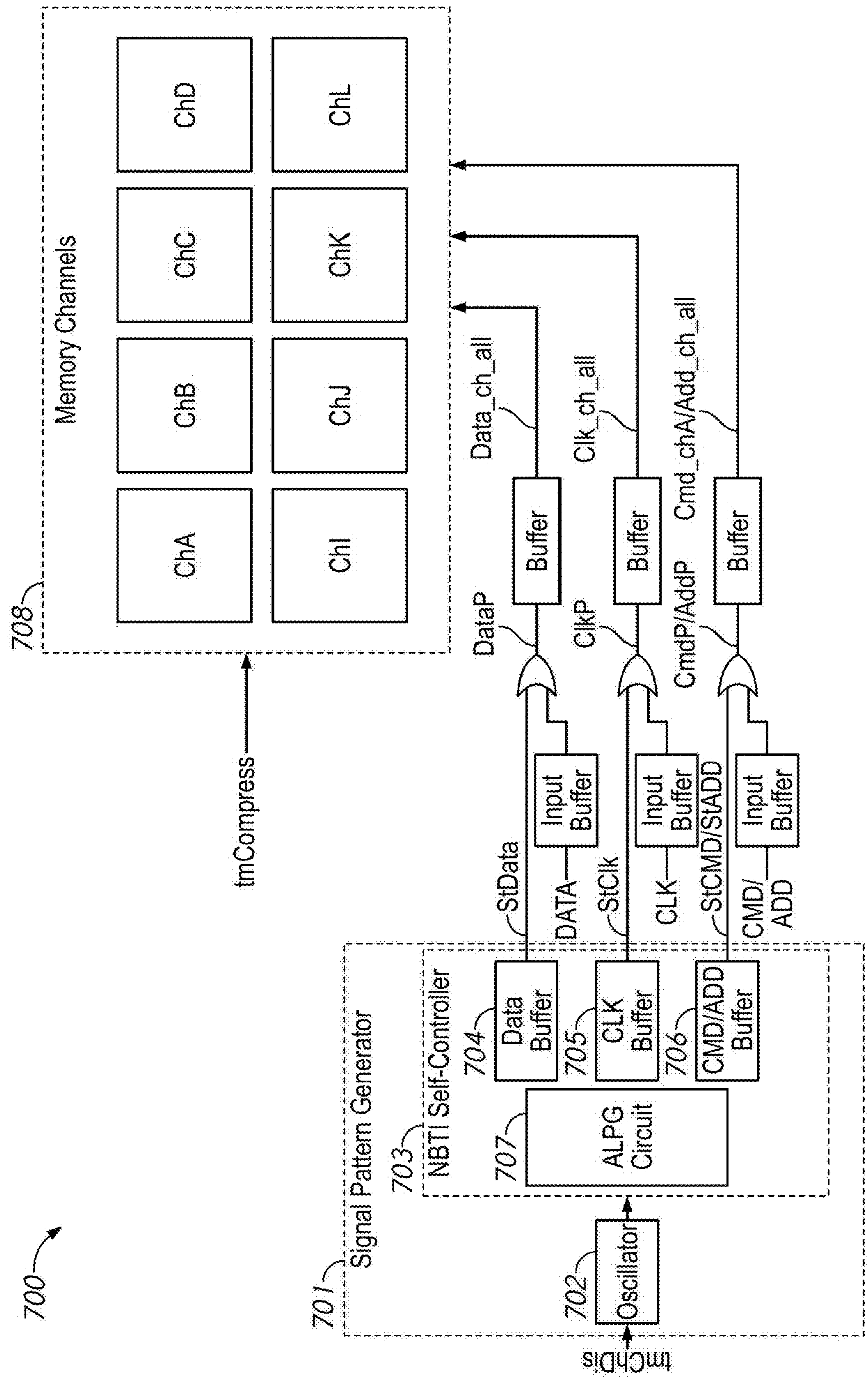
FIG. 7 is a block diagram of an example apparatus according to an embodiment of the disclosure.

FIG. 7 is a block diagram of an example apparatus 700 according to an embodiment of the disclosure. The apparatus 700 includes a signal pattern generator 701 and a memory device 708. The signal pattern generator 701 includes an oscillator 702 and an NBTI self-controller 703. In some embodiments, the oscillator 702 and the NBTI self-controller 703 are included in an NBTI controller, for example, NBTI controller 101. The NBTI self-controller 703 may be included in the controller 103 in such embodiments of the disclosure.

The NBTI self-controller 703 includes a data buffer 704, a clock buffer 705, and a command and address buffer 706, and an algorithmic programmable (ALPG) circuit 707. The memory device 708 includes a plurality of memory channels ChA-ChL as well as a bank logic circuit, a data latch circuit, and a command and address latch circuit.

The circuits, paths, buffers, and such illustrated in FIG. 7 may be the same or substantially the same as the corresponding circuits, paths, buffers, and such in the aforedescribed embodiments and examples, except some modifications specific to a parallel function mode for at least two or more channels or all channels of the memory device 708.

In some cases, on a target memory device, all memory banks in all channels may need to be protected from NBTI degradation at the same time during the device idle state. For such cases, the memory device 708 enters a parallel function mode upon receipt of a test mode signal (tmCompress) specific to the parallel-function-mode. The tmCompress may be supplied from a tester coupled to the apparatus 700 and/or from a test mode generator circuit in the apparatus 700. In this mode, command decoder circuits of CMD/ADD latch circuits (such as the CMD decoders 301 and 302 of the CMD/ADD latch circuit 300 in FIG. 3) of all memory channels disregard or do not respond to channel information which are included in the command and address signals. Instead, the same inputs of clock, command/address and data are shared among all memory channels. During NBTI mitigation, the StData, StClk, and StCMD/StADD signals provided by the signal pattern generator 701 are provided to the memory device 708 over the interface paths and circuits as respectively, data input Data_ch_all, a clock input Clk_ch_all, and a CMD/ADD input Cmd_ch_all/Add-_ch_all. The data input Data_ch_all, clock input Clk_ch_all, and CMD/ADD input Cmd_ch_all/Add_ch_all are provided to all memory channels so that NBTI mitigation can be performed for all memory channels.

In the present embodiments and the examples, the NBTI controller 101, 203, 402 or 703 may not be limited to NBTI degradation control. It may be applicable to positive BTI (PBTI) degradation control as appropriate.

Figure 8:
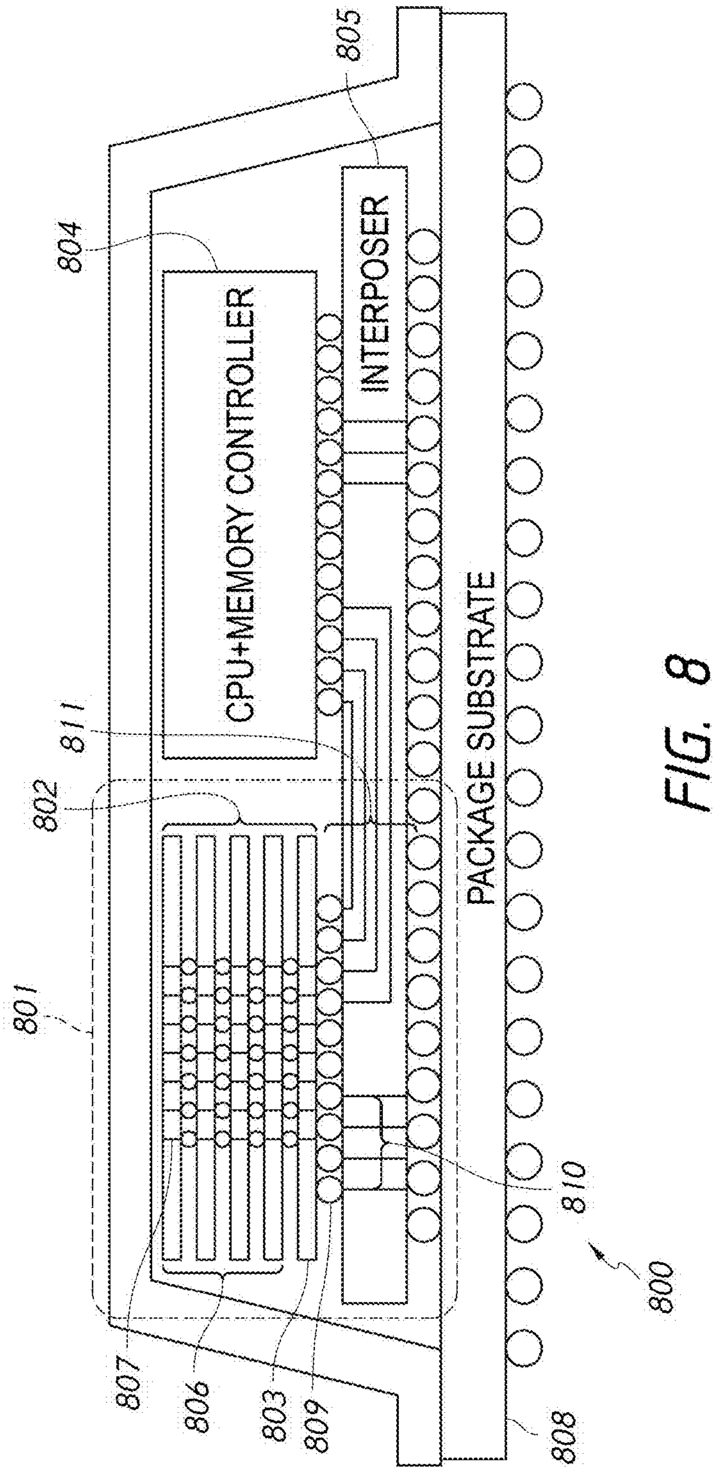
FIG. 8 depicts a schematic configuration of an example semiconductor system according to an embodiment of the disclosure.

FIG. 8 depicts a schematic configuration of an example semiconductor system 800 according to an embodiment of the disclosure. The semiconductor system 800 includes a semiconductor memory device 801 in an embodiment of the disclosure. The semiconductor memory device 801 may include the memory device 104, 208, or 708. In some embodiments of the disclosure, the semiconductor memory device 801 includes the NBTI controller 101, the signal pattern generator 201, and/or the signal pattern generator 701. The semiconductor system 800 may also include a central processing unit (CPU) and memory controller 804, which may be a controller chip, on an interposer 805 on a package substrate 808. The interposer 805 may include one or more power lines 810 which may supply power supply voltage from the package substrate 808. The interposer 805 may include a plurality of channels 811 that may interconnect the CPU and memory controller 804 and the semiconductor memory device 801. The semiconductor memory device 801 may be a dynamic random access memory (DRAM). The memory controller 804 may provide a clock signal, a command signal, and may further transmit and receive data signals. The plurality of channels 811 may transmit the data signals between the memory controller 804 and the memory device 801.

The semiconductor memory device 801 may include a plurality of dies (or chips) 802 including at least one interface (IF) die (or chip) 803 and a plurality of memory core dies (or chips) 806 stacked with each other. A number of the memory core dies 806 may not be limited to four as in the illustrated example, and may be more or fewer as appropriate. Each of the memory core dies 806 may include a plurality of memory cells and circuitries accessing the memory cells. For example, the memory cells may be DRAM cells. The memory cells may be arranged in array. The semiconductor memory device 801 may include conductive vias 807 which couple the IF die 803 and the memory core dies 806 by penetrating the IF die 803 and the memory core dies 806. The IF die 803 may be coupled to the interposer 805 via interconnects 809. For example, the interconnects 809 may be microbumps having bump pitches of less than about or less than one hundred micrometers and exposed on an outside of the IF die 803. A portion of each of the interconnects 809 may be coupled to the one or more power lines 810. Another portion of each of the interconnects 809 may be coupled to one or more of the channels 811.

DRAM is merely one example, and the embodiments and the descriptions herein are not intended to be limited to DRAM. Memory devices other than DRAM, such as a static random-access memory (SRAM), a flash memory, an erasable programmable read-only memory (EPROM), a magnetoresistive random-access memory (MRAM), and a phase-change memory, can also be applied as the memory device 801. Furthermore, devices other than memory, including logic ICs, such as a microprocessor and an application-specific integrated circuit (ASIC), are also applicable as the semiconductor device according to the present embodiments.

Figure 9:
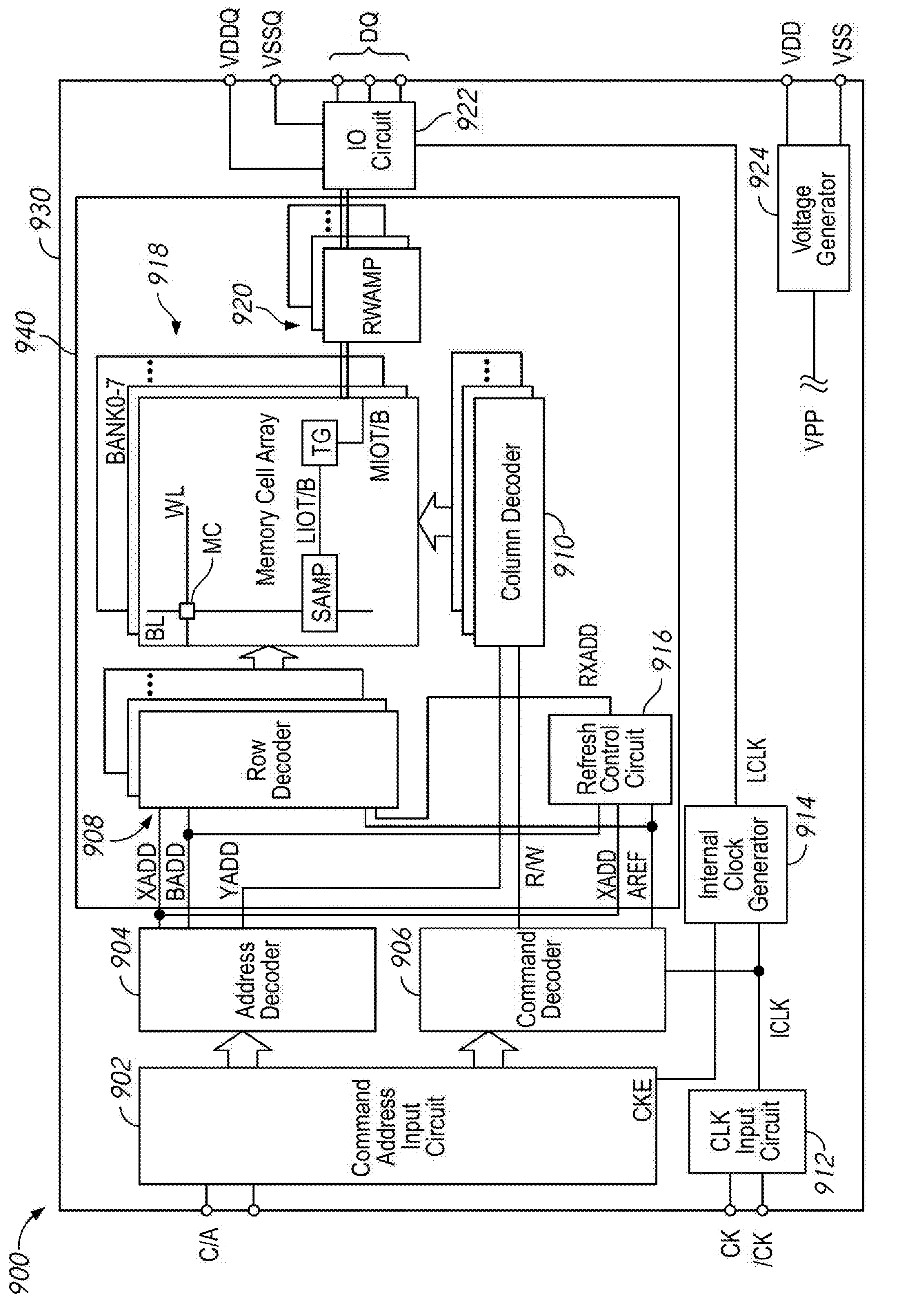
FIG. 9 is a block diagram of an example semiconductor system according to an embodiment of the disclosure.

FIG. 9 is a block diagram of an example semiconductor device 900 according to an embodiment of the disclosure. The semiconductor device 900 may be a semiconductor memory device, such as a DRAM device. In some embodiments of the disclosure, the semiconductor device 900 is included in a semiconductor memory device, for example, the semiconductor memory device 801 of FIG. 8. The DRAM device may include an interface die and a plurality of core dice which are stacked on the interface die. In the example diagram of FIG. 9, certain components are shown located on an interface die 930, while other components are shown as part of each of a core dice 940. For the sake of clarity, only a single core die 940 and its components are shown, however, there may be multiple core dies (e.g., 2, 4, 6, 8, 16, or more) each with similar components to each other. The example semiconductor device 900 of FIG. 9 shows a particular arrangement of components between the interface die 930 and the core die 940, however other arrangements may be used in other embodiments (e.g., a refresh control circuit 916 may be on the interface die 930 in some embodiments). For the sake of illustration, the core die 940 is drawn as a box which is smaller than the interface die 930, however the core die 940 and interface die 930 may have any size relationship to each other. For example, the core die 940 and interface die 930 may be approximately the same size.

The semiconductor device 900 includes a memory array 918 on each of the core dice 140. The memory array 918 is shown as including a plurality of memory banks. In the embodiment of FIG. 9, the memory array 918 is shown as including eight memory banks BANK0-BANK7. More or fewer banks may be included in the memory array 918 of other embodiments. Each memory bank includes a plurality of word lines WL, a plurality of bit lines BL, and a plurality of memory cells MC arranged at intersections of the plurality of word lines WL and the plurality of bit line BL. The selection of the word line WL is performed by a row decoder 908 and the selection of the bit lines BL is performed by a column decoder 910, each of which may also be located on each of the core dice. In the embodiment of FIG. 9, the row decoder 908 includes a respective row decoder for each memory bank and the column decoder 910 includes a respective column decoder for each memory bank. The bit lines BL are coupled to a respective sense amplifier (SAMP) of the memory array 918. Read data from the bit line BL is amplified by the sense amplifier SAMP, and transferred to read/write amplifiers (RWAMPs) 920 over complementary local data lines (LIOT/B), transfer gate (TG), and complementary main data lines (MIOT/B) which are coupled to RWAMP 920. Conversely, write data outputted from RWAMP 920 is transferred to the sense amplifier SAMP over the complementary main data lines MIOT/B, the transfer gate TG, and the complementary local data lines LIOT/B, and written in the memory cell MC coupled to the bit line BL The semiconductor device 900 may employ a plurality of external terminals located on the interface die 930 that include command and address (C/A) terminals coupled to a command and address bus to receive commands and addresses, and a CS signal, clock terminals to receive clocks CK and/CK, data terminals DQ to provide data, and power supply terminals to receive power supply potentials VDD, VSS, VDDQ, and VSSQ.

The clock terminals on the interface die 930 are supplied with external clocks CK and /CK that are provided to an input circuit 912. The external clocks may be complementary. The input circuit 912 generates an internal clock ICLK based on the CK and/CK clocks. The ICLK clock is provided to the command decoder 906 and to an internal clock generator 914. The internal clock generator 914 provides various internal clocks LCLK based on the ICLK clock. The LCLK clocks may be used for timing operation of various internal circuits. The internal data clocks LCLK are provided to an input/output (I/O) circuit 922 to time operation of circuits included in the I/O circuit 922, for example, to data receivers to time the receipt of write data.

The internal clocks LCLK may include a read clock (RCLK) which is used to control the timing of read operations, and write clock (WCLK) which is used to control the timing of write operations. The internal clocks may be passed both to the I/O circuits 922 and also to internal components of the core dice 940 such as RWAMP 920.

The C/A terminals may be supplied with memory addresses. The memory addresses supplied to the C/A terminals are transferred, via a command/address input circuit 902, to an address decoder 104. The address decoder 104 receives the address and supplies a decoded row address XADD to the row decoder 908 and supplies a decoded column address YADD to the column decoder 910. The address decoder 104 may also supply a decoded bank address BADD, which may indicate the bank of the memory array 918 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to the command decoder 906 via the command/address input circuit 902. The command decoder 906 includes circuits to decode the internal command signals to generate various internal signals and commands for performing operations. For example, the command decoder 906 may provide a row command signal to select a word line and a column command signal to select a bit line.

The semiconductor device 900 may receive an access command which is a read command. When a read command is received, and a bank address, a row address and a column address are timely supplied with the read command, read data is read from memory cells in the memory array 918 corresponding to the row address and column address. The read command is received by the command decoder 906, which provides internal commands so that read data from the memory array 918 is provided to RWAMP 920. The read data is output to outside the semiconductor device 900 from the data terminals DQ via the I/O circuit 922.

The semiconductor device 900 may receive an access command which is a write command. When the write command is received, and a bank address, a row address and a column address are timely supplied with the write command, and write data is supplied through the DQ terminals to RWAMP 920. The write data supplied to the data terminals DQ is written to a memory cells in the memory array 918 corresponding to the row address and column address. The write command is received by the command decoder 906, which provides internal commands so that the write data is received by data receivers in the I/O circuit 922. Write clocks may also be provided to the external clock terminals for timing the receipt of the write data by the data receivers of the I/O circuit 922. The write data is supplied via the I/O circuit 922 to RWAMP 920.

The semiconductor device 900 may also receive commands causing it to carry out one or more refresh operations as part of a self-refresh mode. In some embodiments, the self-refresh mode command may be externally issued to the semiconductor device 900. In some embodiments, the self-refresh mode command may be periodically generated by a component of the device. In some embodiments, when an external signal indicates a self-refresh entry command, the refresh signal AREF may also be activated.

The power supply terminals are supplied with power supply potentials VDD and VSS. The power supply potentials VDD and VSS are supplied to an internal voltage generator circuit 924. The internal voltage generator circuit 924 generates various internal potentials such as VPP, VOD, VARY, VPERI, and the like based on the power supply potentials VDD and VSS supplied to the power supply terminals.

The power supply terminals are also supplied with power supply potentials VDDQ and VSSQ. The power supply potentials VDDQ and VSSQ are supplied to the I/O circuit 922. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the I/O circuit 922 so that power supply noise generated by the I/O circuit 922 does not propagate to the other circuit blocks.

Although various embodiments of the disclosure have been described in detail, it will be understood by those skilled in the art that embodiments of the disclosure may extend beyond the specifically described embodiments to other alternative embodiments and/or uses and modifications and equivalents thereof. In addition, other modifications which are within the scope of the disclosure will be readily apparent to those of skill in the art based on the described embodiments. It is also contemplated that various combination or sub-combination of the specific features and aspects of the embodiments may be made and still fall within the scope of the disclosure. It should be understood that various features and aspects of the embodiments can be combined with or substituted for one another in order to form varying mode of the embodiments. Thus, it is intended that the scope of the disclosure should not be limited by the particular embodiments described above.

What is claimed is:

1. An apparatus, comprising:

a memory device including a command and address latch circuit, a data latch circuit, and a bank logic circuit; and a negative-bias temperature instability (NBTI) controller including an oscillator and an algorithmic programmable circuit, wherein the oscillator is configured to generate a toggling clock signal responsive to an active enable signal for an NBTI mitigation mode, the algorithmic programmable circuit includes a sequencer and a formatter, the sequencer is configured to generate a sequence command signal responsive to the toggling clock signal, the sequence command signal identifying a function to be performed at a predetermined timing, the formatter is configured to generate a formatted command and address signal based on the sequence command signal and the toggling clock signal in accordance with a predefined memory command/address protocol, such that the formatted command and address signal contains command information and address information, has command and address transition timings aligned with the toggling clock signal, and is decodable by the command and address latch circuit. and when the memory device in an idle state enters the NBTI mitigation mode, the formatted command and address signal is supplied to the command and address latch circuit to cause the command and address latch circuit to:

decode the command information and the address information contained in the formatted command and address signal;

cause the data latch circuit to communicate with the bank logic circuit and output a data signal through a data bus; and send internal command and address signals to the bank logic circuit.

2. The apparatus according to claim 1, wherein the active enable signal is provided by a tester coupled to the apparatus or by a test mode generation circuit in the apparatus.

3. The apparatus according to claim 1, wherein the apparatus includes an interface device and one or more core memory devices stacked on the interface device, the memory device is included in the one or more core memory devices, and the NBTI controller is included in the interface device or the one or more core memory devices.

4. The apparatus according to claim 1, wherein the NBTI controller further includes at least one of a data buffer, a clock buffer, or a command/address buffer.

5. The apparatus according to claim 1, wherein the NBTI controller further includes:

a data buffer configured to supply a data signal to the data latch circuit; and a command/address buffer configured to supply the formatted command and address signal to the command and address latch circuit.

6. The apparatus according to claim 1, wherein the NBTI controller further includes a clock buffer configured to delay the toggling clock signal and output a delayed toggling clock signal to the command and address latch circuit, and the command and address transition timings of the formatted command and address signal are aligned with pulses of the toggling clock signal and the delayed toggling clock signal.

7. The apparatus according to claim 1, wherein the sequence command signal identifies at least one of a write sequence or a read sequence at predefined timings, and each timing is aligned with at least one of rising edges and falling edges of the toggling clock signal.

8. The apparatus according to claim 7, wherein the write sequence includes activation, write, and pre-charge, and the read sequence includes activation, read, and pre-charge.

9. The apparatus according to claim 1, wherein the algorithmic programmable circuit further includes a counter configured to count a number of functions to be repeated in the NBTI mitigation mode.

10. The apparatus according to claim 1, wherein the algorithmic programmable circuit further includes a data topology controller configured to receive a data flip command signal from the sequencer to manage a polarity of a data signal.

11. The apparatus according to claim 10, wherein the data topology controller generates a data signal responsive to the data flip command signal, and the data signal is supplied to the data latch circuit through a data buffer.

12. The apparatus according to claim 1, wherein the formatter has a two-stage configuration including a first command formatter and a second command formatter.

13. An apparatus, comprising:

a memory device including a command and address latch circuit, a data latch circuit, and a bank logic circuit; and a negative-bias temperature instability (NBTI) controller including an oscillator and an algorithmic programmable circuit, wherein the oscillator is configured to generate a toggling clock signal responsive to an active enable signal for an NBTI mitigation mode, the algorithmic programmable circuit includes a sequencer and a formatter, the sequencer is configured to generate a sequence command signal responsive to the toggling clock signal, the sequence command signal identifying a function to be performed at a predetermined timing, the formatter is configured to generate a formatted command and address signal based on the sequence command signal and the toggling clock signal in accordance with a predefined memory command/address protocol, such that the formatted command and address signal contains command information and address information, has command and address transition timings aligned with the toggling clock signal, and is decodable by the command and address latch circuit, and when the memory device in an idle state enters the NBTI mitigation mode, the command and address latch circuit receives the formatted command and address signal and decodes the command information and the address information, and causes internal paths and circuits, including the data latch circuit and the bank logic circuit, downstream of the command and address latch circuit in the memory device, to operate based on signals, including internal command and address signals from the command and address latch circuit and a data signal from the data latch circuit, to mitigate NBTI degradation of the internal paths and circuits, wherein the operation of the internal paths and circuits is repeated until the active enable signal indicates that the NBTI mitigation mode is exited.

14. The apparatus according to claim 13, wherein the NBTI controller further includes:

a data buffer configured to supply a data signal to the data latch circuit;

a command/address buffer configured to supply the formatted command and address signal to the command and address latch circuit; and a clock buffer configured to delay the toggling clock signal and to supply the delayed toggling clock signal to the command and address latch circuit.

15. The apparatus according to claim 13, wherein the sequence command signal identifies at least one of activation, write, read, or pre-charge at predetermined timings, and each timing is aligned with at least one of rising edges or falling edges of at least one of the toggling clock signal or a delayed toggling clock signal.

16. The apparatus according to claim 13, wherein the algorithmic programmable circuit further includes a data topology controller configured to receive a data flip command signal from the sequencer and generate a data signal to be supplied to the data latch circuit through a data buffer.

17. A negative-bias temperature instability (NBTI) controller for a memory device, comprising:

an oscillator configured to generate a toggling clock signal responsive to an active enable signal for an NBTI mitigation mode; and an algorithmic programmable circuit including:

a sequencer configured to generate a sequence command signal responsive to the toggling clock signal, wherein the sequence command signal identifies a function to be performed at a predetermined timing; and a formatter configured to generate a formatted command and address signal based on the sequence command signal and the toggling clock signal in accordance with a predefined memory command/address protocol, wherein the formatted command and address signal contains command information and address information, has command and address transition timings aligned with the toggling clock signal, and is decodable by a command and address latch circuit of the memory device for the command information and the address information, and when the memory device in an idle state enters the NBTI mitigation mode, the formatted command and address signal is supplied to the command and address latch circuit to cause the command and address latch circuit to:

decode the command information and the address information contained in the formatted command and address signal;

cause a data latch circuit of the memory device to communicate with a bank logic circuit of the memory device and output a data signal through a data bus; and send internal command and address signals to the bank logic circuit.

18. The NBTI controller according to claim 17, wherein the command and address transition timings are further aligned with a delayed clock signal of the toggling clock signal in accordance with the predefined memory command/address protocol.

19. The NBTI controller according to claim 17, wherein the sequence command signal identifies at least one of activation, write, read, or pre-charge at predetermined timings, and each timing is aligned with at least one of rising edges or falling edges of at least one of the toggling clock signal or a delayed toggling clock signal.

20. The NBTI controller according to claim 17, further comprising:

a data buffer configured to supply a data signal to the data latch circuit; and a command/address buffer configured to supply the formatted command and address signal to the command and address latch circuit.

* * * * *